(12) United States Patent
Patra

(10) Patent No.: US 8,593,645 B2
(45) Date of Patent: Nov. 26, 2013

(54) MICROLITHOGRAPHIC PROJECTION EXPOSURE APPARATUS AND RELATED METHOD

(75) Inventor: Michael Patra, Oberkochen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 104 days.

(21) Appl. No.: 13/330,964

(22) Filed: Dec. 20, 2011

(65) Prior Publication Data
US 2012/0105865 A1 May 3, 2012

Related U.S. Application Data

(63) Continuation of application No. PCT/EP2009/005225, filed on Jul. 17, 2009.

(51) Int. Cl.
G01B 11/24 (2006.01)

(52) U.S. Cl.
USPC .......................... 356/601; 356/614

(58) Field of Classification Search
USPC .................................. 356/601–614
See application file for complete search history.

(56) References Cited

U.S. PATENT DOCUMENTS

| | | | |
|---|---|---|---|
| 5,191,200 A * | 3/1993 | van der Werf et al. | 250/201.4 |
| 5,523,193 A * | 6/1996 | Nelson | 430/311 |
| 6,084,673 A * | 7/2000 | Van Den Brink et al. | 356/492 |
| 6,965,436 B2 * | 11/2005 | Latypov et al. | 356/520 |
| 7,061,582 B2 | 6/2006 | Zinn et al. | |
| 7,116,404 B2 * | 10/2006 | Lof et al. | 355/67 |
| 7,197,828 B2 * | 4/2007 | Lof et al. | 33/1 M |
| 7,411,652 B2 * | 8/2008 | Bleeker et al. | 355/53 |
| 7,548,302 B2 * | 6/2009 | Bleeker et al. | 355/67 |
| 2002/0015158 A1 * | 2/2002 | Shiode et al. | 356/614 |
| 2004/0036977 A1 | 2/2004 | Tanaka et al. | |
| 2005/0018294 A1 | 1/2005 | Hauschild | |
| 2006/0087634 A1 | 4/2006 | Brown et al. | |
| 2009/0128886 A1 | 5/2009 | Hirota | |

FOREIGN PATENT DOCUMENTS

| | | |
|---|---|---|
| EP | 1 262 836 | 12/2002 |
| WO | WO 2005/026843 | 3/2005 |
| WO | WO 2005/078522 | 8/2005 |
| WO | WO 2008/095695 | 8/2008 |
| WO | WO 2009/080310 | 7/2009 |
| WO | WO 2010/102649 | 9/2010 |

OTHER PUBLICATIONS

International Search for Corresponding PCT Appl No. PCT/EP2009/005225, dated May 10, 2010.

* cited by examiner

Primary Examiner — Tarifur Chowdhury
Assistant Examiner — Isiaka Akanbi
(74) Attorney, Agent, or Firm — Fish & Richardson P.C.

(57) ABSTRACT

A microlithographic projection exposure apparatus includes an optical surface and a measurement device which measures a parameter related to the optical surface at a plurality of separated areas on the optical surface. The measurement device includes an illumination unit which directs individual measuring light beams towards the areas on the optical surface. Each measuring light beam illuminates at least a portion of an area, which is associated with the measuring light beam, and at least a portion of an adjacent area which is not associated with the measuring light beam. A detector unit measures a property for each measuring light beam after it has interacted with the optical surface.

20 Claims, 8 Drawing Sheets

MICROLITHOGRAPHIC PROJECTION EXPOSURE APPARATUS AND RELATED METHOD

CROSS-REFERENCE TO RELATED APPLICATIONS

This application is a continuation of, and claims benefit under 35 USC 120 to, international application PCT/EP2009/005225, filed Jul. 17, 2009. International application PCT/EP2009/005225 is hereby incorporated by reference in its entirety.

FIELD

The disclosure generally relates to microlithographic exposure apparatus that image a mask onto a light sensitive surface, and in particular to such apparatus including an optical surface, for example a mirror or a mirror array, and a measurement device which is configured to measure a parameter related to the optical surface at a plurality of locations. The disclosure further relates to a method of measuring such a parameter.

BACKGROUND

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) or extreme ultraviolet (EUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of a rectangular or curved slit, for example.

Ideally, the illumination system illuminates each point of the illuminated field on the mask with projection light having a well defined irradiance and angular distribution. The term angular distribution describes how the total light energy of a light bundle, which converges towards a particular point in the mask plane, is distributed among the various directions of the rays that constitute the light bundle.

The angular distribution of the projection light impinging on the mask is usually adapted to the kind of pattern to be projected onto the photoresist. For example, relatively large sized features may involve a different angular distribution than small sized features. The most commonly used angular distributions of projection light are referred to as conventional, annular, dipole and quadrupole illumination settings. These terms refer to the irradiance distribution in a system pupil surface of the illumination system. With an annular illumination setting, for example, only an annular region is illuminated in the system pupil surface. Thus there is only a small range of angles present in the angular distribution of the projection light, and thus all light rays impinge obliquely with similar angles onto the mask.

Different approaches are known in the art to modify the angular distribution of the projection light in the mask plane so as to achieve the desired illumination setting. For achieving maximum flexibility in producing different angular distribution in the mask plane, it has been proposed to use mirror arrays that illuminate the pupil surface.

In EP 1 262 836 A1 the mirror array is realized as a microelectromechanical system (MEMS) including more than 1000 mirrors. Each of the mirrors can be tilted about two orthogonal tilt axes. Thus radiation incident on such a mirror device can be reflected into almost any desired direction of a hemisphere. A condenser lens arranged between the mirror array and the pupil surface translates the reflection angles produced by the mirrors into locations in the pupil surface. This known illumination system makes it possible to illuminate the pupil surface with a plurality of spots, wherein each spot is associated with one particular microscopic mirror and is freely movable across the pupil surface by tilting this mirror.

Similar illumination systems are known from US 2006/0087634 A1, U.S. Pat. No. 7,061,582 B2 and WO 2005/026843 A2. Similar arrays of tiltable mirrors have also been proposed for EUV illumination systems.

In such arrays the orientation of the individual mirrors typically has to be controlled with great accuracy and at high speed. To this end it has been proposed to use a closed-loop control. Such a control scheme involves that the orientation of each mirror be monitored with a high repetition frequency.

International application WO 2008/095695 A1 discloses a measurement device which makes it possible to measure the orientation of each individual mirror. To this end an illumination unit is provided which produces for each mirror an individual measuring light beam. A detector unit measures the angle of the light beams after they have been reflected from the mirrors. If the direction of the light beams impinging on the mirrors is known, the orientation of the mirrors can be determined by an evaluation unit on the basis of the measured directions of the reflected light beams. By using time or frequency multiplexing it is possible to distinguish the measuring light beams so that the orientation of the mirrors can be determined sequentially or even in one go.

A known illumination unit uses an array of laser diodes, for example vertical cavity surface emitting lasers (VCSEL), as light sources producing the measuring light beams that are directed on the mirrors. For each laser diode an imaging lens is provided that is arranged in front of the laser diode and images the light exit facet of the diode on one of the mirrors. The imaging lenses preferably form a microlens array having the same pitch as the laser diodes.

However, it has turned out that under the most preferred dimensions of such measurement devices the measurement accuracy is often not satisfactory.

This can also be encountered in similar measurements within the field of microlithographic projection exposure apparatus. For example, in the projection objectives of such apparatus there are sometimes lenses or mirrors having an optical surface which can be deformed in order to correct aberrations. Deformations of the optical surface may be accomplished, for example, with the help of actuators exerting mechanical forces, or by directing radiation on certain areas on the optical surface. For controlling the deformation process the shape of the optical surface can be measured using a measurement device which is configured to measure a parameter related to the optical surface at a plurality of areas. Since it does not really matter whether the optical surface is continuous or discontinuous (as it is the case with a mirror array), the measurement accuracy achievable with such measurement devices is sometimes not satisfactory.

SUMMARY

The disclosure provides a microlithographic projection exposure apparatus including an optical surface and a measurement device, which is configured to measure a surface related parameter at a plurality of areas on the optical surface, wherein the measurement device has an improved measurement accuracy. The disclosure also provides a method of measuring such a parameter with an improved measurement accuracy.

The disclosure provides a microlithographic projection exposure apparatus including an optical surface and a measurement device which is configured to measure a parameter related to the optical surface at a plurality of separated areas on the optical surface. The measurement device includes an illumination unit which is configured to direct individual measuring light beams towards the areas on the optical surface. Each measuring light beam illuminates at least a portion of an area, which is associated with the measuring light beam, and at least a portion of an adjacent area which is not associated with the measuring light beam. A detector unit is provided which is configured to measure a property for each measuring light beam after it has interacted with the optical surface. An evaluation unit is configured to determine the surface related parameter for a selected area on the basis of the properties determined by the detector unit for the measuring light beam that is associated with the selected area, and for at least one measuring light beam that is associated with an area adjacent to the selected area.

The disclosure is based on the perception that the measurement accuracy is severely reduced if a measuring light beam illuminates not only the area which is associated with this particular measuring light beam, but also at least one area which is associated with a another measuring light beam. However, instead of attempting to reduce the size of the spots illuminated by the measuring light beams such that these spots do not extend to adjacent areas, the disclosure compensates for this adverse effect by taking into account not only a property measured for the selected area, but also a property measured for at least one other area. These other areas may be the immediately neighboring areas, or, for an even better measuring accuracy, the immediately neighboring areas plus the next but one neighboring areas. In other embodiments all areas on which measuring light beams are directed are taken into account when the surface related parameter for the selected area is determined by the evaluation unit.

In one embodiment the parameter related to the optical surface and measured at a plurality of areas defines the shape of the optical surface. This is particularly useful because it makes it possible to measure the shape of the optical surface in a contact-free manner with a high accuracy. However, the parameter related to the optical surface may also be the transmittance or the reflectance of the optical surface, for example. The parameter may also be the refractive index of an optical material having an interface forming the optical surface. The disclosure is thus not restricted to surface shape measurement devices.

A shape measurement of the optical surface is particularly useful if the apparatus includes a surface deformation unit which is configured to deform the optical surface. Such deformations may be produced to reduce wavefront errors in optical systems, in particular in the projection objective of the projection exposure apparatus. The surface deformation unit may include actuators configured to produce forces which act upon the optical surface, for example in order to bend the optical element including the optical surface. The surface deformation unit may also include heating light sources which direct light towards selected areas on the optical surface. Absorption of heating light then causes a deformation of the optical surface. The measurement device may then form part of a closed-loop control and monitor the surface deformation produced by the surface deformation unit.

In one embodiment the optical surface is configured such that it reflects at least a substantial portion of the measuring light. For example, the optical surface may be formed by an adaptive mirror which is used in the projection exposure apparatus to correct aberrations. However, the optical surface may also be formed on a refractive optical element such as a lens. In this case the (albeit small) fraction of light reflected from the optical surface may suffice to measure the surface related parameter. In a preferred embodiment the optical surface is configured such that it reflects more than 10%, such as more than 50%, of the measuring light.

In another embodiment the optical surface is formed by an array of mirrors that are adapted to reflect an impinging light ray by a reflection angle that is variable in response to a control signal. This may be achieved by deforming the mirror surfaces, or more easily by providing mirrors that are configured to be tilted by at least one tilt axis. In many cases each area will then be formed by a mirror surface. If the mirrors are large enough, also more than one area may be arranged on each mirror surface. Generally, at least one area is associated with each mirror surface.

Such an array of mirrors may be arranged in an illumination system of the apparatus. The mirrors then direct projection light towards a system pupil surface of the illumination system. This makes it possible to flexibly vary the illumination setting, i.e. the angular light distribution of the light impinging on the mask.

In one embodiment each measuring light beam produces on the associated area a point of maximum intensity. These points of maximum intensity are slightly and irregularly displaced with regard to the centers of the mirrors. This irregularity improves the stability of the numerical computation of the surface related parameter. If the displacements are regular, as it will often be the case, this has neither an adverse, nor an advantageous effect. Displacements of the points of maximum intensity may also occur if a redundancy shall be provided such that more than one measuring light beam is associated with each area.

Since the measuring light beams are allowed to illuminate also adjacent areas, this will generally result in a partial overlap of spots illuminated on the optical surface. However, if the points of maximum intensity are decentered, it may also happen that no spot overlap occurs.

The evaluation unit may be configured to determine the surface related parameter for the selected area on the basis of the properties determined by the detector unit for all measuring light beams produced by the illumination unit. Thus the surface related parameter for the selected area is known only after the properties for all areas have been measured.

Assuming an at least approximately linear response in the detector unit, this may be achieved by solving the following system of linear equations:

$$y_k = \sum_l A_{kl} x_l,$$

wherein the surface related parameter for the selected area k is given by $x_k$, and wherein $y_k$ is the property measured by the detector unit for the measuring light beam directed towards the area k, and $A_{kl}$ are real coefficients. These real coefficients may be determined by calibration, for example, or by simulation.

According to another embodiment the evaluation unit is configured to determine the surface related parameter for the selected area only on the basis of the properties determined by the detector unit for the measuring light beams that are directed towards areas being the next and the next but one neighbors of the selected area. This exploits the fact that usually the irradiance at the illuminated area drops off considerably towards the circumference of the illuminated area. Consequently, it is possible to disregard the small fraction of measuring light which impinges on areas which are further away from the selected area without unduly incurring substantial measuring errors.

The areas on the optical surface may be illuminated by collimated or slightly diverging light beams. Since the areas are allowed to overlap, the disclosure does not require that the areas have to be extremely small, as is the case with certain known solutions. However, it may nevertheless have a positive effect on the measurement accuracy if the overlap of the areas is small. This can be achieved with an illumination unit which includes a plurality of illumination members, with each member having a light exit facet which is configured to emit measuring light, wherein the light exit facets are imaged on the optical surface.

For imaging the light exit facets on the optical surface, a plurality of imaging systems may be used, wherein each imaging system is associated with one light exit facet. In order to reduce adverse diffraction effects, it may be preferable to use imaging systems which are associated with at least two or more light exit facets, i.e. which commonly image more than one light exit facet on the optical surface.

A method can be performed to measure a parameter related to an optical surface, which is contained in a microlithographic projection exposure apparatus, at a plurality of separated areas on the optical surface. The method includes the following steps:
a) directing individual measuring light beams towards the areas on the optical surface, wherein each measuring light beam illuminates at least a portion of the area which is associated with the measuring light beam, and at least a portion of an adjacent area which is not associated with the measuring light beam;
b) measuring a property for each measuring light beam after it has interacted with the optical surface;
c) determine the surface related parameter for a selected area on the basis of the properties determined in step b) for
  i) the measuring light beam that is associated with the selected area and for
  ii) at least one measuring light beam that is associated with an area adjacent to the selected area.

BRIEF DESCRIPTION OF THE DRAWINGS

Various features and advantages of the present disclosure may be more readily understood with reference to the following detailed description taken in conjunction with the accompanying drawings, in which.

DESCRIPTION OF THE PREFERRED EMBODIMENTS

I.

General Structure of Projection Exposure Apparatus

Figure 1:
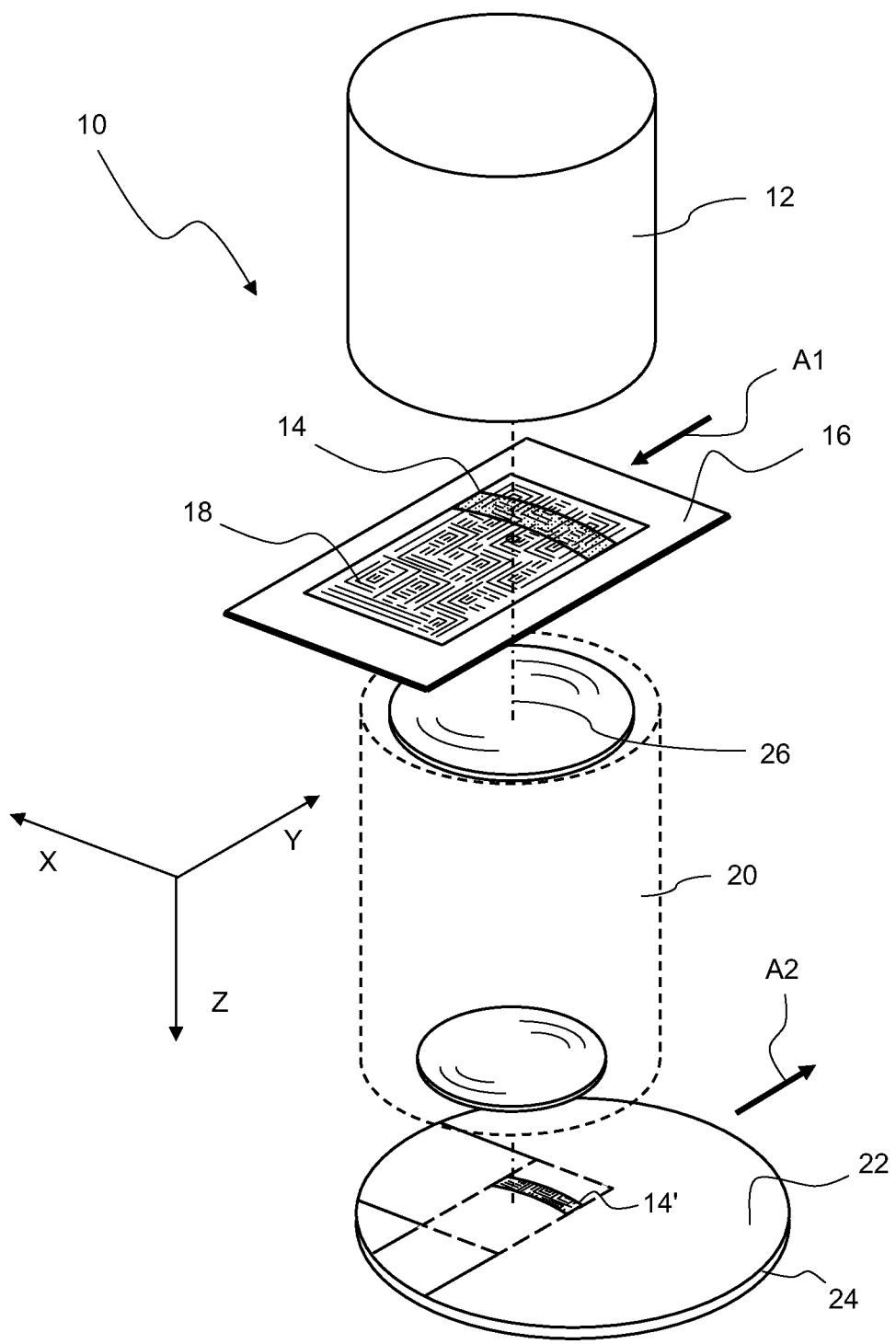
FIG. 1 is a perspective and considerably simplified view of a projection exposure apparatus in accordance with the present disclosure.

FIG. 1 is a perspective and highly simplified view of a VUV projection exposure apparatus 10 that includes an illumination system 12 for producing a projection light beam. The projection light beam illuminates a field 14 on a mask 16 containing minute structures 18. In this embodiment the illuminated field 14 has approximately the shape of a ring segment. However, other, for example rectangular, shapes of the illuminated field 14 are contemplated as well.

A projection objective 20 images the structures 18 within the illuminated field 14 onto a light sensitive layer 22, for example a photoresist, which is deposited on a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification of less than 1, a reduced image 14' of the structures 18 within the illuminated field 14 is projected onto the light sensitive layer 22.

During the projection, the mask 16 and the substrate 24 move along a scan direction which coincides with the Y direction. Thus the illuminated field 14 scans over the mask 16 so that structured areas larger than the illuminated field 14 can be continuously projected. Such a type of projection exposure apparatus is often referred to as "step-and-scan apparatus" or simply a "scanner". The ratio between the velocities of the mask 16 and the substrate 24 is equal to the inverse magnification of the projection objective 20. If the projection objective 20 inverts the image, the mask 16 and the substrate 24 move in opposite directions, as this is indicated in FIG. 1 by arrows A1 and A2. However, the present disclosure may also be used in stepper tools in which the mask 16 and the substrate 24 do not move during projection of the mask.

In the embodiment shown, the illuminated field 14 is not centered with respect to an optical axis 26 of the projection objective 20. Such an off-axis illuminated field 14 may be desirable with certain types of projection objectives 20. In other embodiments, the illuminated field 14 is centered with respect to the optical axis 26.

EUV projection exposure apparatus have the same basic structure. However, because there are no optical materials that are transparent for EUV radiation, only mirrors are used as optical elements, and also the mask is of the reflective type.

II.

General Structure of Illumination System

Figure 2:
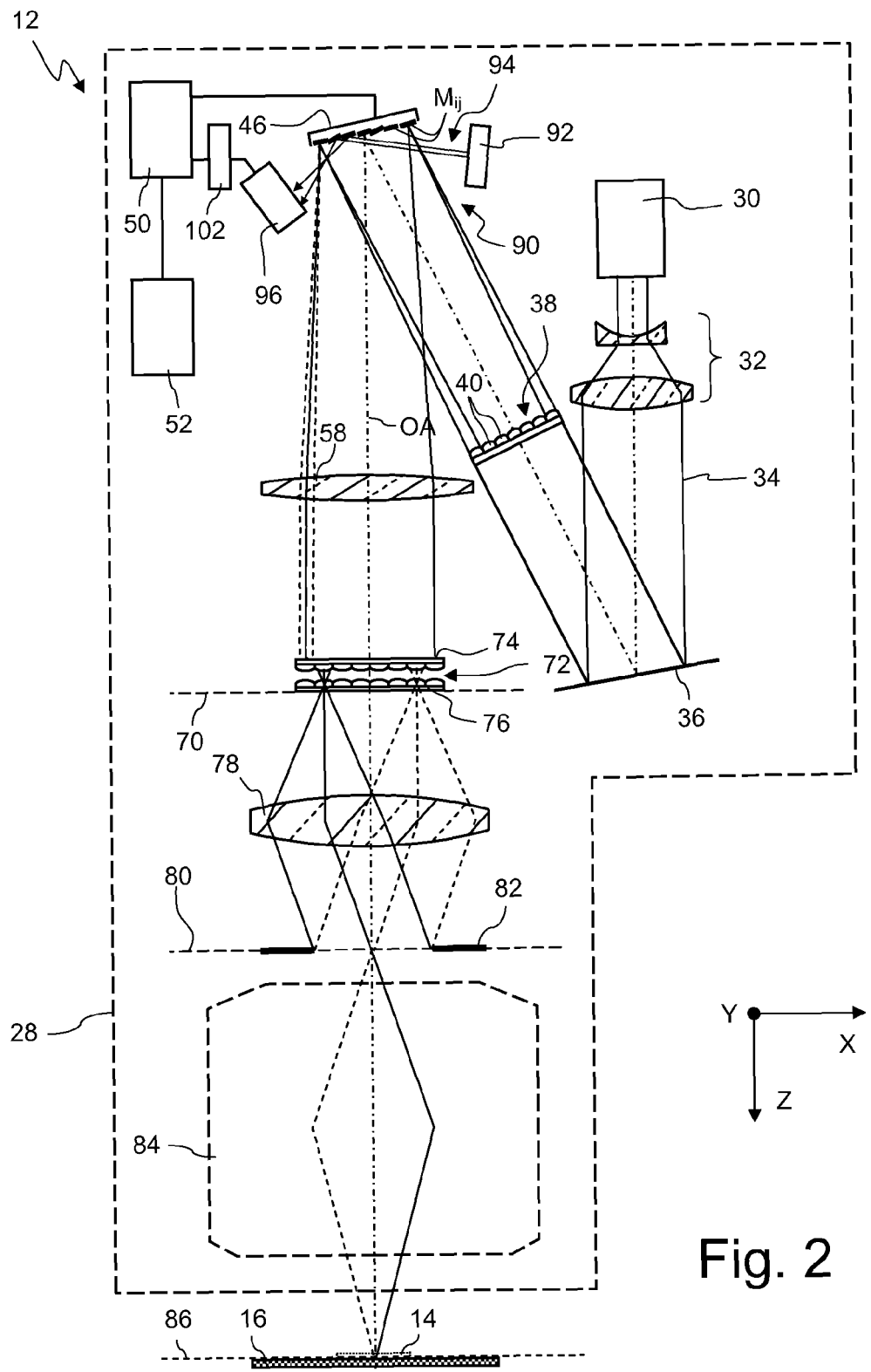
FIG. 2 is a meridional section through an illumination system contained in the projection exposure apparatus shown in FIG. 1.

FIG. 2 is a more detailed meridional section through the VUV illumination system 12 shown in FIG. 1. For the sake of clarity, the illustration of FIG. 2 is considerably simplified and not to scale. This particularly implies that different optical units are represented by very few optical elements only. In reality, these units may include significantly more lenses and other optical elements.

The illumination system 12 includes a housing 28 and a light source that is, in the embodiment shown, realized as an excimer laser 30. The excimer laser 30 emits projection light that has a wavelength of about 193 nm. Other types of light sources and other wave-lengths, for example 248 nm or 157 nm, are also contemplated.

In the embodiment shown, the projection light emitted by the excimer laser 30 enters a beam expansion unit 32 in which the light beam is expanded without altering the geometrical optical flux. The beam expansion unit 32 may include several lenses as shown in FIG. 2, or may be realized as a mirror arrangement, for example. The projection light emerges from the beam expansion unit 32 as a substantially collimated beam 34. In other embodiments, this beam may have a significant divergence. The collimated beam 34 impinges on a plane folding mirror 36 provided for reducing the overall dimensions of the illumination system 12.

After reflection from the folding mirror 36, the beam 34 impinges on an array 38 of microlenses 40. A mirror array 46 is arranged in or in the vicinity to a back focal plane of the microlenses 40. As will be explained in more detail below, the mirror array 46 includes a plurality of small individual mirrors $M_{ij}$ that can be tilted, independently from each other, by two tilt axes that are preferably aligned perpendicularly to each other. The total number of mirrors $M_{ij}$ may exceed 100 or even several 1000. The reflecting surfaces of the mirrors $M_{ij}$ may be plane, but could also be curved, if an additional reflective power is desired. Apart from that, the mirror surfaces may support diffractive structures. In this embodiment the number of mirrors $M_{ij}$ is equal to the number of microlenses 40 of the microlens array 38 that are illuminated by the beam 34. Thus each microlens 40 directs a converging light beam on one mirror $M_{ij}$ of the mirror array 46.

The tilting movements of the individual mirrors $M_{ij}$ are controlled by a mirror control unit 50 which is connected to an overall system control 52 of the illumination system 12. Actuators that are used to set the desired tilt angles of the mirrors $M_{ij}$ receive control signals from the mirror control unit 50 such that each individual mirror $M_{ij}$ is capable of reflecting an impinging light ray by a reflection angle that is variable in response to the control signal. In the embodiment shown there is a continuous range of tilt angles at which the individual mirrors $M_{ij}$ can be arranged. In other embodiments, the actuators are configured such that only a limited number of discrete tilt angles can be set.

Figure 3:
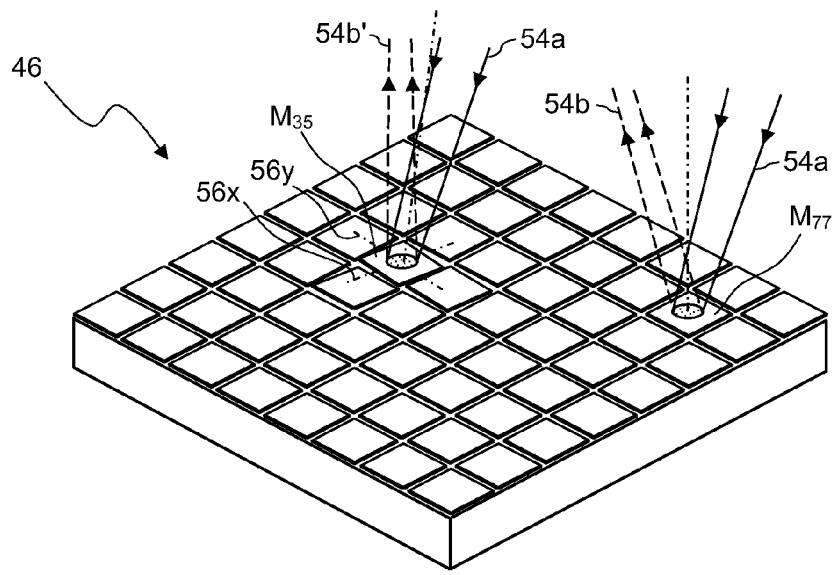
FIG. 3 is a perspective view of a mirror array contained in the illumination system of FIG. 2.

FIG. 3 is a perspective view of the mirror array 46 including, for the sake of simplicity, only 8×8=64 mirrors $M_{ij}$. Light beams 54a impinging on the mirror array 46 are reflected to different directions depending on the tilt angles of the mirrors $M_{ij}$. In this schematic representation it is assumed that a particular mirror $M_{35}$ is tilted about two tilt axes 56x, 56y relative to another mirror $M_{77}$ so that the light beams 54b, 54b' which are reflected by the mirrors $M_{35}$ and $M_{77}$, respectively, are reflected into different directions.

Referring again to FIG. 2, the light beams reflected from the mirror $M_{ij}$ impinge on a first condenser 58 which ensures that the slightly diverging light beams impinge, now as at least substantially parallel light beams, on an optical integrator 72 which produces a plurality of secondary light sources. The optical integrator 72 increases the range of angles formed between the light rays and an optical axis OA of the illumination system 12. In other embodiments, the first condenser 58 is dispensed with so that the light beams impinging on the optical integrator 72 have a larger divergence.

The optical integrator 72 is realized, in the embodiment shown, as a fly's eye lens including two substrates 74, 76 that each includes two orthogonal arrays of parallel cylindrical microlenses. Other configurations of the optical integrator are envisaged as well, for example integrators including an array of microlenses that have rotationally symmetrical surfaces, but rectangular boundaries. Reference is made to WO 2005/078522 A, US 2004/0036977 A1 and US 2005/0018294 A1, in which various types of optical integrators suitable for the illumination system 12 are described.

Reference numeral 70 denotes a system pupil surface of the illumination system 12 that substantially defines the angular distribution of the light impinging on the mask 14. The system pupil surface 70 is usually plane or slightly curved and is arranged in or in immediate vicinity to the optical integrator 72. As the angular light distribution in the system pupil surface 70 directly translates into an intensity distribution in a subsequent field plane, the optical integrator 72 substantially determines the basic geometry of the illuminated field 14 on the mask 16. Since the optical integrator 72 increases the range of angles considerably more in the X direction than in the scan direction Y, the illuminated field 14 has larger dimensions along the X direction than along the scan direction Y.

The projection light emerging from the secondary light sources produced by the optical integrator 72 enters a second condenser 78 that is represented in FIG. 2 by a single lens only for the sake of simplicity. The second condenser 78 ensures a Fourier relationship between the system pupil surface 70 and a subsequent intermediate field plane 80 in which a field stop 82 is arranged. The second condenser 78 superimposes the light bundles, which are produced by the secondary light sources, in the intermediate field plane 80, thereby achieving a very homogenous illumination of the intermediate field plane 80. The field stop 82 may include a plurality of movable blades and ensures (to the extent desired) sharp edges of the illuminated field 14 on the mask 16.

A field stop objective 84 provides optical conjugation between the intermediate field plane 80 and the mask plane 86 in which the mask 16 is arranged. The field stop 82 is thus sharply imaged by the field stop objective 84 onto the mask 16.

III.

Measurement Device

The orientation of the mirrors, i.e. the tilting angles with regard to the tilt axes $56x$, $56y$ (see FIG. 3), has to be controlled very accurately. This is because the pattern produced on the light sensitive surface 22 is very sensitive to variations of the intensity distribution in the system pupil plane 70, which depends on the orientation of the mirrors $M_{ij}$.

The orientation of the mirrors $M_{ij}$ can only be controlled accurately if it is possible to measure the orientation of the mirrors $M_{ij}$ individually. To this end the illumination system 12 includes a measurement device 90 which is configured to direct measuring light beams on each mirror $M_{ij}$ and to measure the direction of measuring light beams reflected therefrom.

In other embodiments the measuring device 90 is configured to not only measure the orientation of the mirrors $M_{ij}$, but also the shape of the reflecting surface of the mirrors $M_{ij}$. These shapes may change during operation of the projection exposure apparatus 10, for example as a result of heat caused by absorption of high energy projection light. In EUV illumination systems the problem of heat induced deformations is of particular concern because a larger fraction of projection light is absorbed by the mirrors as compared to DUV illumination systems. For measuring the shape of the individual mirrors $M_{ij}$, it is desirable to obtain a surface related parameter (such as a surface normal or a distance) not only for one location on each mirror $M_{ij}$, but for a plurality of locations.

In either case the surfaces of the mirrors $M_{ij}$ may be considered as commonly forming a larger optical surface. The measuring device 90 then measures a certain parameter, which is related to this optical surface, at a plurality of areas, namely on the surfaces of the mirrors $M_{ij}$, on this optical surface. There may also be two or more such areas on each mirror $M_{ij}$. The parameter may be, for example, a surface normal or a distance. In this embodiment the parameter is suitable to describe the orientation of the mirrors $M_{ij}$ and thus the shape of the optical surface commonly formed by the mirrors $M_{ij}$.

The measurement device 90 feeds the measured parameter to the control unit 50. The latter may then readjust some or all mirrors $M_{ij}$ if the deviations between the measured mirror orientations and target orientations exceed predetermined threshold values. More details regarding the control of the mirrors $M_{ij}$ can be gleaned WO 2009/080310 A1.

The general structure of the measurement device 90 will now be explained with reference to FIG. 2 and also to FIG. 4 which is an enlarged and more detailed cutout from FIG. 2:

The measurement device 90 includes an illumination unit 92 which directs to each mirror $M_{ij}$ an individual measuring light beam 94. After reflection from the mirrors $M_{ij}$ the measuring light beams 94 enter a detector unit 96 including detector optics 98 and a position resolving sensor 100. The detector optics 98 may include a condenser which translates the directions of the measuring light beams 94 into positions on the position resolving sensor 100. The positional data obtained by the sensor 100 are supplied to an evaluation unit 102 which is configured to determine the orientation of the mirrors $M_{ij}$ on the basis of the directions of the reflected measuring light beams 94 measured by the detector unit 96. These data are then fed to the control unit 50, as has been explained above. More details with regard to the detector unit 96 are described in the aforementioned WO 2008/095695 A1.

In order to be able to measure the orientation of each mirror $M_{ij}$ individually, the measurement device 90 has to be capable of identifying from which mirror $M_{ij}$ a detected measuring light beam 94 has been reflected. One approach in this respect is to use an illumination unit 92 including a plurality of individual illumination members 103. Each member 103 produces a measuring light beam 94 which is directed to one of the mirrors $M_{ij}$. Since the illumination members 103 can be controlled individually, it is possible to use optical multiplexing, for example in the time or frequency domain, to distinguish the measuring light beams 94 detected by the sensor 100.

Figure 4:
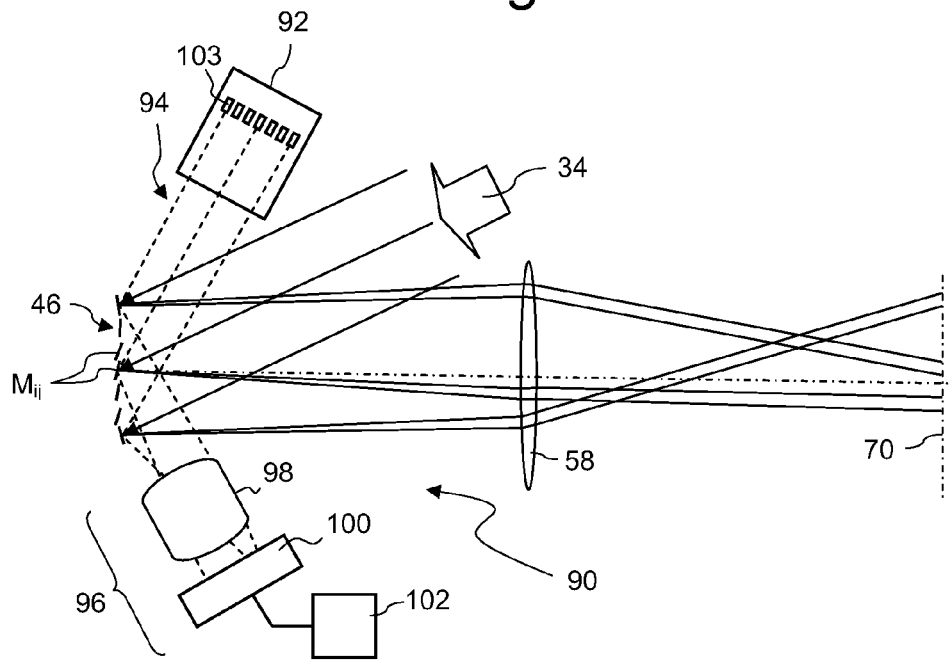
FIG. 4 is an enlarged cutout of FIG. 2 showing a measurement device.

In the simplest case the illumination members produce collimated or slightly diverging measuring light beams 94, as is illustrated in FIG. 4. Each measuring light beam 94 illuminates a certain spot on one of the mirrors $M_{ij}$. However, the illumination unit 92 desirably does not obstruct the light path of the collimated projection light 34, and therefore it has to be arranged at some distance away from the mirror array 46. If the measuring light beams 94 are allowed to diverge on their way from the illumination unit 92 to the mirror array 46, the spots illuminated on the mirrors $M_{ij}$ will be so large that these spots cannot be confined to individual mirrors $M_{ij}$.

Therefore the aforementioned WO 2008/095695 A proposes to use individual optical imaging members for each illumination member. Each imaging member images a light exit facet of the illumination member onto the associated mirror $M_{ij}$. Each imaging member is formed by a positive lens, and the lenses form a microlens array. This makes it possible to significantly reduce the size of the spot which is illuminated by each illumination member on the mirror array 46. In principle it is even possible to illuminate spots on the mirror array which are smaller than the light exit facets of the illumination members. However, under the most preferred geometrical conditions (pitches of illumination members, pitches of mirrors and distance between illumination members and mirrors) diffraction significantly blurs the images of the light exit facets.

The limits caused by diffraction are relieved if two or more, and preferably all, light exit facets are commonly imaged by a larger imaging system. This is illustrated in the schematic representation of FIG. 5 which is a meridional section through an illumination unit 92 illuminating areas on the mirror array 46. Two lenses 114, 116 provide optical conjugation between an object plane 108, in which light exit facets 106 of illumination members 103 are arranged, and an image plane 112 in which the mirrors $M_{ij}$ of the mirror array 46 are arranged. In this embodiment the object plane 108 and the image plane 112 are arranged in an inclined manner in accordance with the Scheimpflug condition. The fulfillment of this condition ensures that, in spite of the inclined arrangement of the object plane 108 and the image plane 112, the light exit facets 106 of the illumination members 103 are sharply illuminated on the mirrors $M_{ij}$. More details with regard to this approach can be taken from international patent application PCT/EP2009/0018027 entitled "Microlithographic Projection Exposure Apparatus" which has been filed by the same applicant on Mar. 13, 2009.

Figure 5:
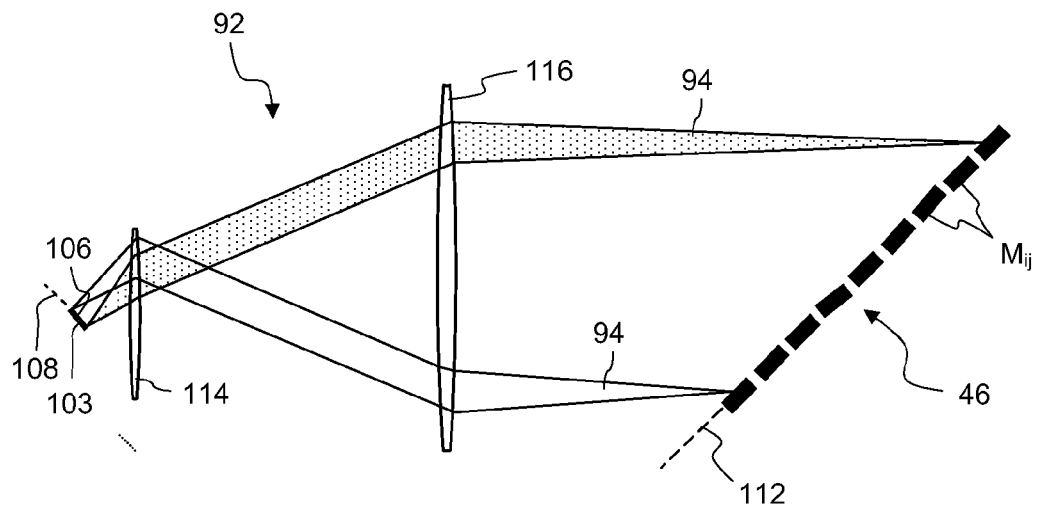
FIG. 5 is a meridional section through an illumination unit which may be used in the measurement device shown in FIG. 4.

With the illumination unit 92 as shown in FIG. 5, it is possible to confine the spots illuminated by the measuring light beams 94 such that they do not extend over adjacent mirrors $M_{ij}$.

Figures 6, 7:
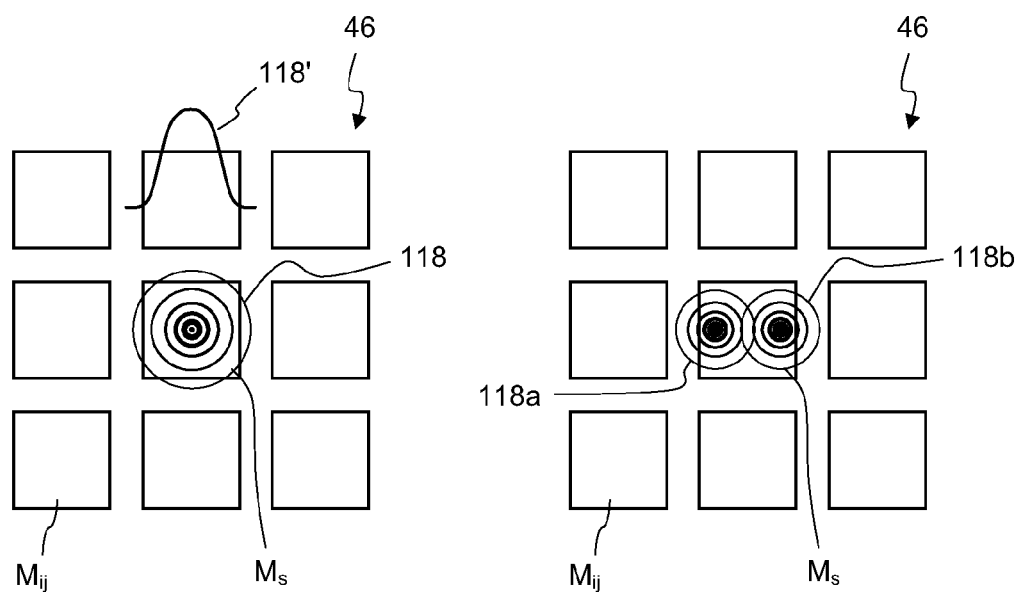
FIG. 6 is a top view on a cutout of the mirror array, wherein the spot illuminated by a measuring light beam does not extend to adjacent mirrors.
FIG. 7 is a top view similar to FIG. 6, but with two smaller spots illuminated on a mirror that do not extend to adjacent mirrors.

This is illustrated in FIG. 6 which is a top view on some of the mirrors $M_{ij}$ of the mirror array 46. Here it is assumed that a spots on a selected mirror $M_s$ shall be illuminated by a measuring light beam 94. The circles in FIG. 6 indicate an irradiance distribution 118 of such a spot. A curve 118' in FIG. 6 schematically represents the irradiance distribution as a function of irradiance vs. radius. As can be seen in FIG. 6, the irradiance distribution 118 completely covers the mirror $M_s$, but does not extend over any of the adjacent mirrors $M_{ij}$.

This prevents measuring light from impinging on adjacent mirrors $M_{ij}$ and being reflected into various directions. Since such misdirected light would also be detected by the detector unit 96, it would, without taking measures as described below, severely reduce the accuracy which is available for the measurement of the orientation of the selected mirror $M_s$. For example, if only 0.04% of the intensity of a measuring light beam 94 impinges on the adjacent mirrors $M_{ij}$, the accuracy which is available for measuring the tilt angles of the selected mirror $M_s$ cannot exceed 0.04%. A fraction of 0.04% of misdirected light implies that, for an exemplary mirror geometry of 0.8 mm×0.8 mm, the spot illuminated on the selected mirror $M_s$ should have a 1/e radius in the order of 0.1 mm for typical irradiance distributions 118. This is, even with the optical layout shown in FIG. 5, difficult to attain.

FIG. 7 illustrates the conditions if not one, but two illumination members 103 shall be capable of illuminating each mirror $M_{ij}$. Such a redundancy may be desirable if there is a significant risk that some of the illumination members 103 will fail during the life time of the apparatus 10. If more than one illumination member 103 is capable of directing a measuring light beam 94 towards a single mirror $M_{ij}$, one of these illumination members 103 can take over in case of failure.

Usually it will not be possible to produce the images of the light exit facets of these two illumination members 103 at the same location on a mirror $M_{ij}$. Therefore the irradiance distributions 118a, 118b produced by these illumination members 103 will generally be slightly displaced, as is shown in FIG. 7. Then the restrictions with regard to the maximum size of the illuminated areas are even more severe if no measuring light is allowed to impinge on adjacent mirrors $M_{ij}$.

Ensuring the conditions as illustrated in FIGS. 6 and 7 involves that the imaging system represented by lenses 114, 116 in FIG. 5 be well corrected, in particular with regard to telecentricity errors. This is because the directions under which the measuring light beams 94 impinge on the mirrors $M_{ij}$ have to be known very accurately. Variations of these imaging properties, for example as a result of thermal effects, have to be prevented or compensated for in order to avoid measurement errors.

In the following a new approach will be described that makes it possible to considerably relax the desired properties of the illumination unit 92, and in particular on the imaging optics that image the light exit facets 106 of the illumination members 103 on the mirror array 46.

1. First Group of Embodiments

Figure 8:
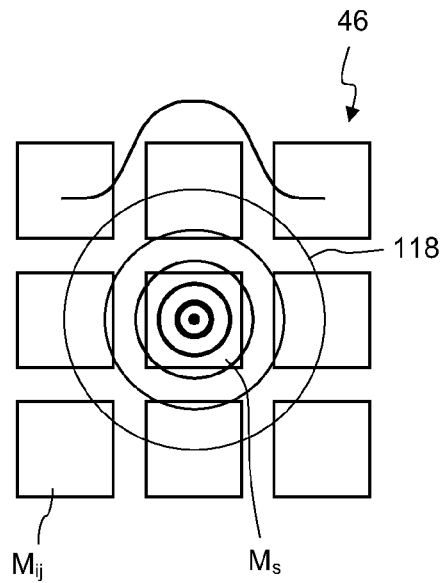
FIG. 8 is a top view similar to FIG. 6 according to a first embodiment in which the illuminated spot does extend to adjacent mirrors.
Figure 9:
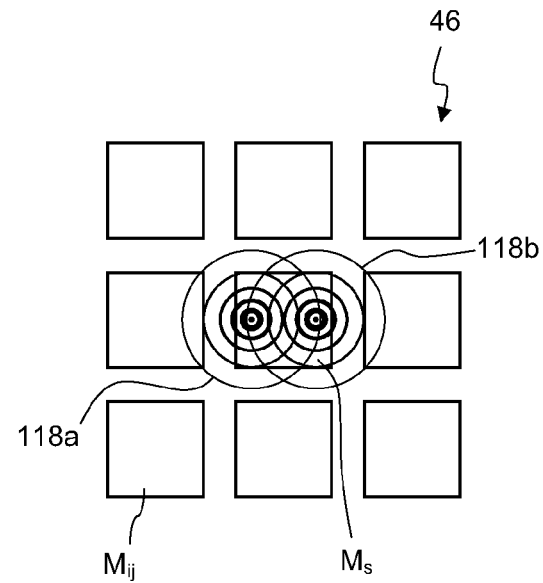
FIG. 9 is a top view similar to FIG. 7 according to a first embodiment in which two illuminated spots do extend to adjacent mirrors.

According to the new approach the spots illuminated by illumination members 103 are allowed to extend to adjacent mirrors $M_{ij}$. In other words, the irradiance distribution 118 extends to at least one other mirror $M_{ij}$. In the embodiment illustrated in FIG. 8 the illuminated spot extends to all immediately neighboring mirrors $M_{ij}$. FIG. 9 illustrates this approach for the case in which two illumination members are associated with each mirror $M_{ij}$, as has been assumed in FIG. 7. As can be seen in FIG. 9, the irradiance distributions 118a, 118b extend to at least one of the neighboring mirror elements $M_{ij}$.

a) Computation Scheme

A degradation of measurement accuracy is prevented by determining the orientations of the mirrors $M_{ij}$ not individually, i.e. in an isolated manner for each mirror $M_{ij}$, but on the basis of measured values obtained for at least one of the neighboring mirrors $M_{ij}$.

This more sophisticated computation scheme will be explained in the following in more detail for the simplified case of a one dimensional mirror array, i.e. an array including N×1 mirrors $M_k$, with k=1, 2, ..., N. This reduction to one dimension shall only simplify the following description; as a matter of course this concept can easily be extended to two dimensional mirror arrays 46, for example by assigning the index k=1, 2, ..., n·m to n×m mirrors $M_{ij}$, or by assigning to each index k a tuple (i,j).

It is assumed that $x_k$ is the tilting angle of a selected mirror $M_k$. If the illumination member 103 associated with this selected mirror $M_k$ is operated, the mirror $M_k$ is illuminated with an irradiance which is assumed to be 1. However, additionally also light with a relative intensity $A_{kl}$ impinges on another mirror $M_l$. The detector unit 96 therefore measures for the selected mirror $M_k$ a property having a value $y_k$ which not only depends on the tilting angle $x_k$, but also on the tilting angles of one or more of the other mirrors. If the detector unit 96 has (at least approximately) a linear response, then this dependence may be expressed by equation (1):

$$y_k = \sum_l A_{kl} x_l. \tag{1}$$

If the response of the detector 96 cannot be assumed to be linear, then equation (1) and, consequently, the following equations become more complex. However, this does not affect the validity of the general principles outlined below.

Equation (1) describes a system of linear equations which can also be written as equation (2):

$$\vec{y} = \vec{\vec{A}} \vec{x} \tag{2}$$

with $\vec{y}=(y_1, y_2, \ldots, y_N)$ being the measured values obtained for the mirrors $M_1$ to $M_N$, $\vec{x}=(x_1, x_2, \ldots, x_N)$ being the tilting angles of the mirrors $M_1$ to $M_N$, and $\vec{\vec{A}}$ being the matrix containing the relative intensities $A_{kl}$.

By solving the system (2) of linear equations, for example using LU decomposition and subsequent backward substitution, the desired values for the tilting angles $x_k$ can be computed on the basis of the measured values $y_k$. As has been mentioned above, the tilting angle $x_k$ for a mirror $M_k$ will always depend not only on the measured value $y_k$, but also at least on one other measured value $y_l$ with $l \neq k$.

The measured values $\vec{y}$ will never be perfectly accurate, but are flawed to some extent. The tilting angles $\vec{x}$ will therefore be computed on the basis of flawed measured values, and thus the computed tilting angles $\vec{x}$ will generally be slightly different from the real tilting angles. As a matter of course, the tilting angles $\vec{x}$ cannot be determined with a higher accuracy as is available for the measured values $\vec{y}$. Instead, there is even a risk that the accuracy of the measured tilting angles $\vec{x}$ is by orders of magnitude worse than the accuracy of the measured values $\vec{y}$. However, simulations have shown that for equation (2) the maximum measurement errors of the computed tilting angles $\vec{x}$ are only slightly (less than 1.2 times) greater than the measurement errors of the measured values $\vec{y}$. The averaged measurement errors of the computed tilting angles $\vec{x}$ are even smaller as if only a single mirror $M_k$ was illuminated, because in the former case statistical errors are reduced as several measurements enter in every computed value $\vec{x}$.

b) Displacement

Figure 10:
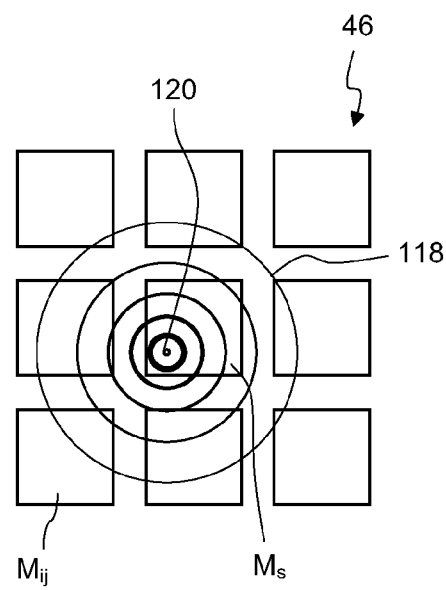
FIG. 10 is a top view similar to FIG. 8, but with an illuminated spot which is decentered with respect to the center of a selected mirror.

There is no compelling ground why the points of maximum intensity of the spots illuminated on the mirrors $M_{ij}$ should be perfectly centered with regard to the surfaces of the mirrors $M_{ij}$. Instead, slight but irregular displacements of these points with regard to the surfaces of the mirror will have a positive effect on the numerical stability of the computation scheme described above. Certain tolerances in the context of this scheme can then be relaxed. An example is shown in FIG. 10 where the center 120 of the irradiance distribution 118 is not centered with respect to the selected mirror $M_s$.

Figure 11:
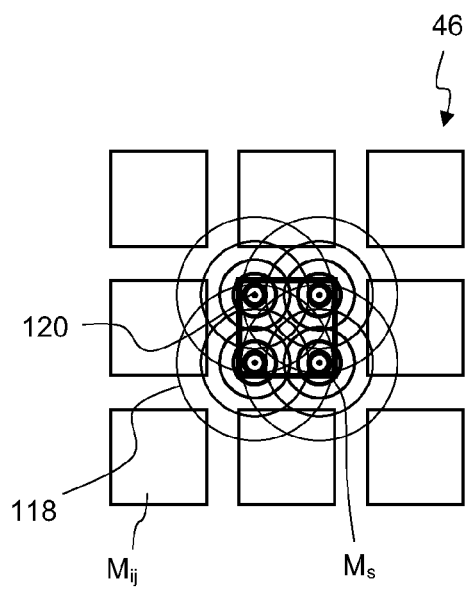
FIG. 11 is a top view similar to FIG. 10, wherein the illuminated spots are placed close to corners of the selected mirror.

If redundancy shall be provided, it will generally be desirable to decenter the points 120 of maximum intensity, as is shown in FIG. 9. FIG. 11 illustrates an embodiment in which a degree of redundancy $D_R=4$ is provided. This means that the number of illumination members 103 is 4 times the number of mirrors $M_{ij}$. The points 120 of maximum intensity are placed on or close to the edges, and in this embodiment close to the corners, of the mirrors $M_{ij}$. Consequently, the selected mirror $M_s$ indicated with thick lines in FIG. 11 can be illuminated by any of four different illumination members 103. If one of these four illumination members 103 fails, another illumination member 103 can take over. It has been shown that the decentering pattern illustrated in FIG. 11 places desired properties on the accuracy of the detection unit 96 which are only slightly above the desired properties which are placed in the case of a centered pattern as shown in FIG. 8.

c) Calibration

For determining the coefficients $A_{kl}$ in equation (1), the following calibration method may be applied:

In a first step all mirrors $M_{ij}$ with the exception of the selected mirror $M_s$ are tilted into a position such that they cannot reflect light towards the detector unit 96. Then the position of the light spot in the system pupil plane 70 will be measured with the help of measurement equipment as it is known in the art.

In a second step all mirrors with the exception of the selected mirror $M_s$ and one of the other mirrors are tilted into a position such that they cannot reflect light towards the detector unit 96. Then the position of both light spots in the system pupil plane 70 will be measured with the help of the measurement equipment.

In this way all coefficients $A_{kl}$ can be determined.

2. Second Group of Embodiments

In order to be able to solve the system (2) of linear equations, the measuring values $\vec{y}$ for all mirrors have to be known. In other words, the tilting angle $\vec{x}$ of a particular mirror $M_k$ can be determined only after measured values $\vec{y}$ for all mirrors of the mirror array 46 have been obtained.

However, it is also possible to determine the tilting angle $x_k$ for a particular mirror $M_k$ if only the measured values of neighboring mirrors have been obtained. This exploits the fact that the spot illuminated by a particular measuring light beam 94 usually only extends to the mirrors arranged in close proximity to the selected mirror $M_s$.

This drop off of the irradiance distribution produced by a particular measuring light beam 94 may be described by a matrix $A_{ij}=\epsilon^{|i-j|}$. This means that a fraction $\epsilon$ of the intensity of the measuring light beam 94 will impinge on any of the immediately neighboring mirrors; a fraction of $\epsilon^2$ will impinge on the next but one neighboring mirrors, and so on. It is to be understood that these assumptions do not necessarily have to be fulfilled for the following considerations to be valid.

The measuring value $y_k$ can be written, under this assumption, as $$y_k = x_k + \epsilon x_{k-1} + \epsilon x_{k+1} + \epsilon^2 x_{k-2} + \epsilon^2 x_{k+2} + \quad (3)$$

This can be resolved to $x_k$ in the following manner:

$$x_k = Y_k - \epsilon x_{k-1} - \epsilon x_{k+1} - \epsilon^2 x_{k-2} - \epsilon^2 x_{k+2} + \quad (4)$$

In a first step the terms $x_{k-1}$ and $x_{k+1}$ according to equation (4) can be resubstituted again in equation (4) which yields $$x_k = y_k - \epsilon y_{k-1} - \epsilon y_{k+1} + 2\epsilon^2 x_k + \epsilon^3 x_{k-3} + \epsilon^3 x_{k-1} + \epsilon^3 x_{k-1} + \epsilon^3 x_{k+3} + \quad (5)$$

Recursively all $\epsilon^n$ x terms up to a desired order can be eliminated in this way. Higher orders of $\epsilon$ will then be ignored in this computation.

Figure 12:
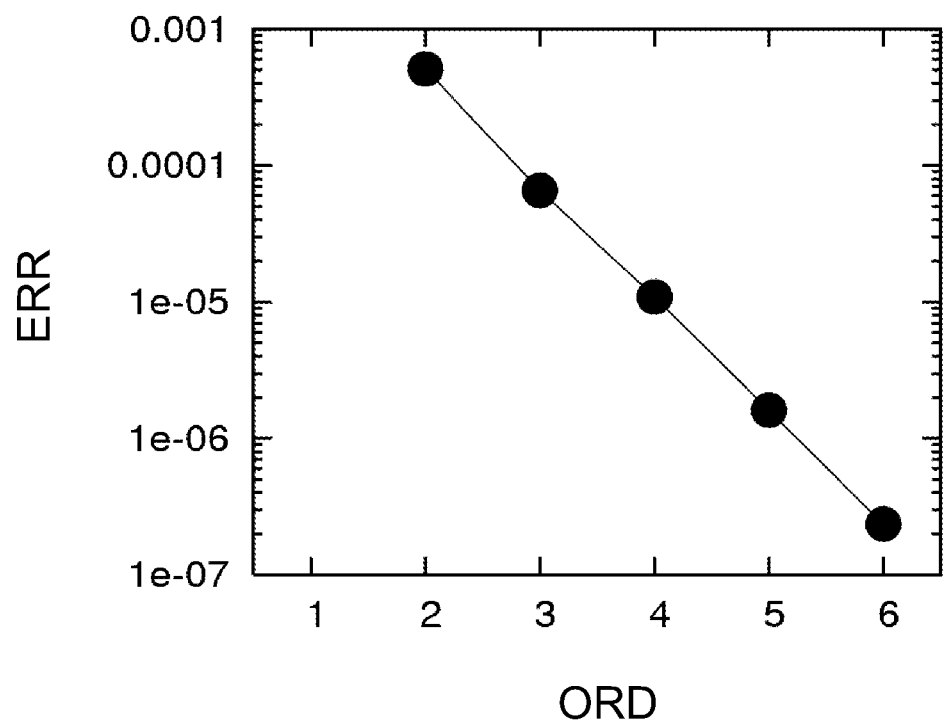
FIG. 12 is a graph illustrating the measuring error depending on the orders of term considered in the computation according to a second embodiment.

The graph of FIG. 12 illustrates the dependency of the error ERR caused by ignoring the higher order terms in equation (5) dependent on the order ORD which is still considered. As can be seen, the error ERR is very small if all orders up to the third order ORD=3 are considered, and all higher orders are neglected. It has been assumed that $\epsilon=1/30$. For $\epsilon>1/8$ the above series does not well converge if the mirrors are arranged in a regular grid as shown in FIGS. 6 to 11. This is because each mirror then has eight immediate neighboring mirrors, and if $\epsilon=1/8$, the irradiance on the selected mirror $M_s$ is the same as the irradiance on all immediately neighboring mirrors.

3. Third Group of Embodiments

Figure 13:
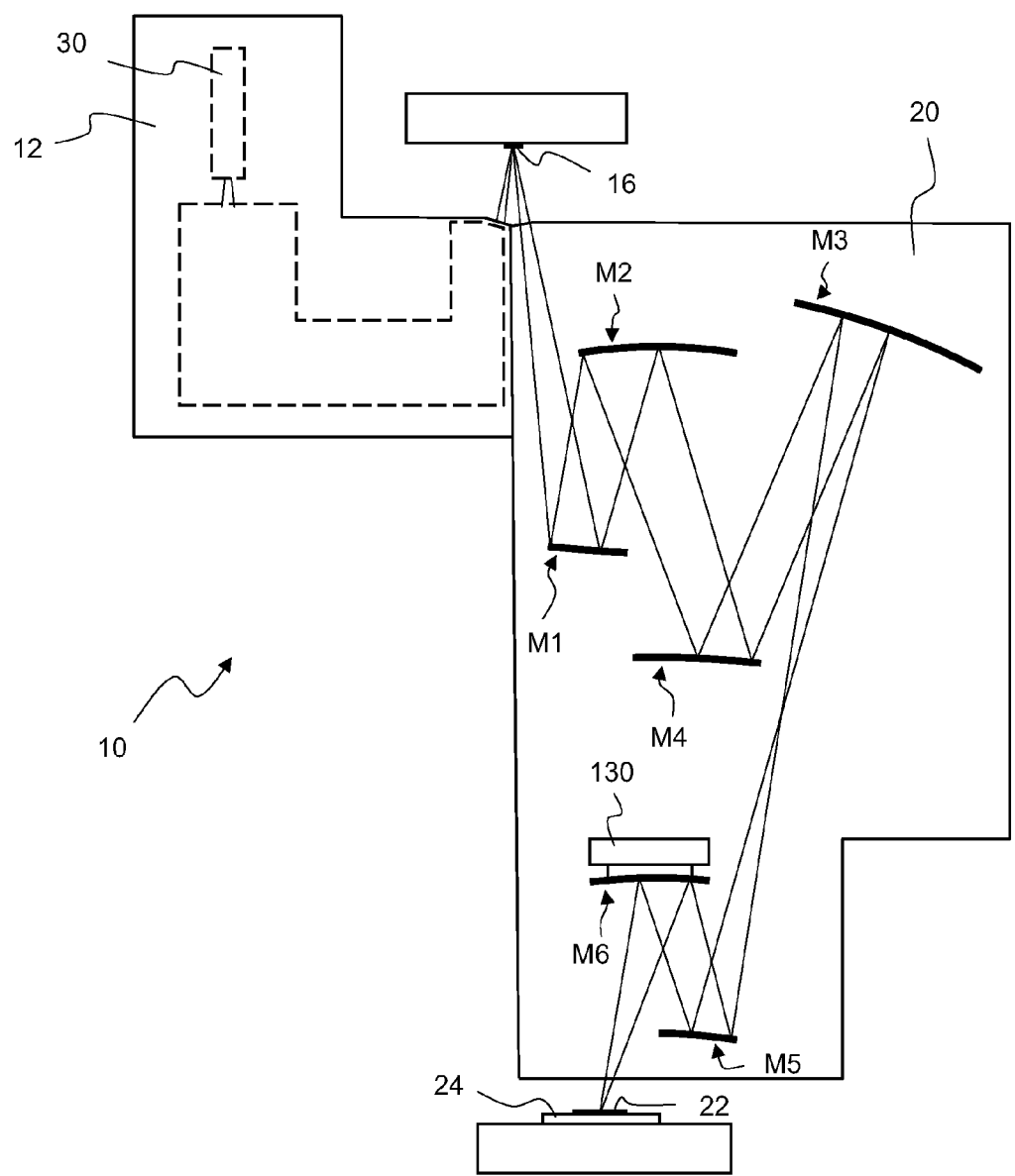
FIG. 13 is a schematic illustration of an EUV projection exposure apparatus including according to a third embodiment.

FIG. 13 is a schematic illustration of an EUV projection exposure apparatus including an illumination system 12 with a EUV radiation source 30, a reflective mask 16 and a projection objective 20. The objective 20 includes six mirrors M1 to M6, which form a reduced image of the mask 16 on a light sensitive surface 22 applied on a support 24.

In the embodiment shown the last mirror M6 is an adaptive mirror. To this end an actuator unit 130 is provided that is configured to deform the reflective surface of the mirror M6. The deformation is determined such that aberrations are reduced. This is particularly useful if the aberrations are time varying. Such time varying aberrations are often caused by variations of the temperature distribution of the mirrors M1 to M6, as they may occur after the mask 16 or the illumination setting produced by the illumination system 12 has been changed.

Figure 14:
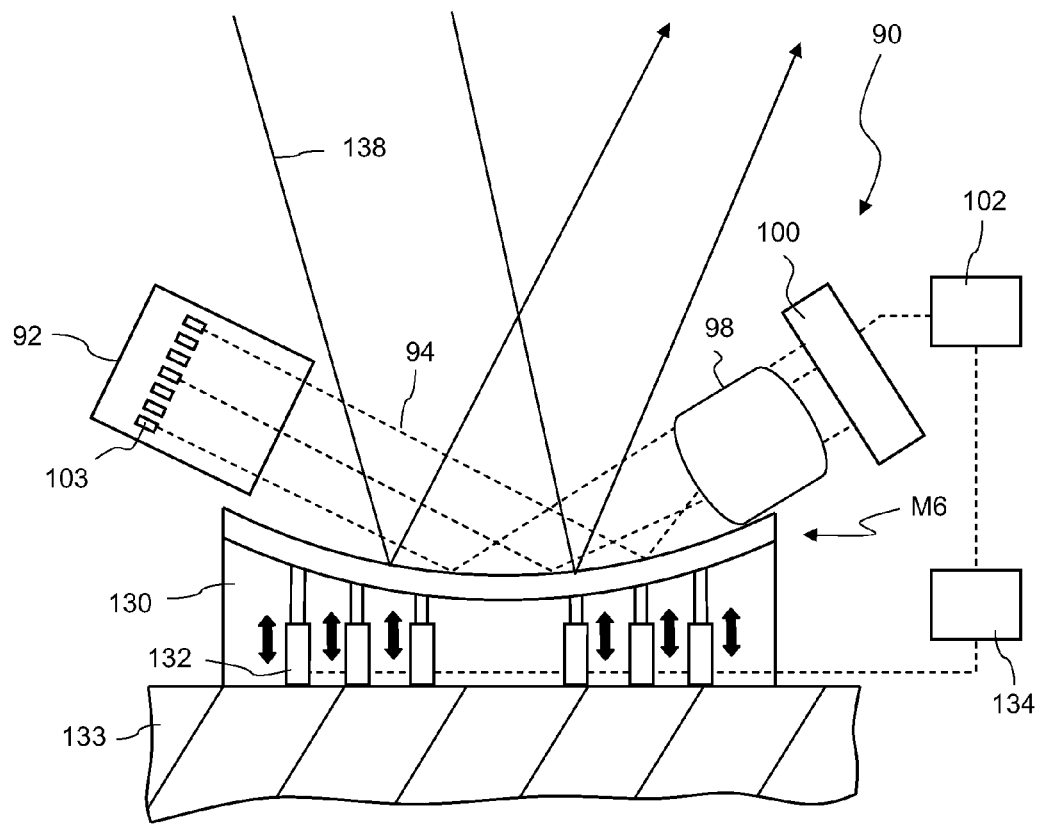
FIG. 14 is an enlarged and more detailed cutout of FIG. 13.

FIG. 14 is a schematic and more detailed section through the mirror M6 and the actuator unit 130. The actuator unit 130 includes a plurality of actuators 132 that are fixed to a common support structure 133 and are configured to exert forces on the mirror M6, as it is indicated in FIG. 16 by double arrows. The actuators 132 are controlled by an actuator control unit 134 which controls the actuators 132 such that a desired surface deformation is achieved.

To this end the projection objective 20 includes substantially the same measurement device 90 as it has been explained above with reference to FIG. 4. The illumination unit 92 includes a plurality of illumination members 103 which direct measuring light beams 94 towards selected and separated areas on the optical surface of the mirror M6. Also in this embodiment the spots illuminated on the mirror M6 are so large that at least one measuring light beam 94 illuminates not only at least a portion of the area which is associated with the measuring light beam 94, but also at least a portion of an adjacent area which is not associated with the measuring light beam 94.

The reflected measuring light beams enter the detector optics 98 of the detector unit 96 and are then detected by the sensor 100. The arrangement of the illumination unit 92 and the detector unit 96 is determined such that it does not interfere with the EUV projection light 138.

The evaluation unit 102 connected to the sensor 100 determines the shape of the mirror M6 on the basis of the directions of light beams as measured by the detector unit 96. The surface shape information obtained by the measurement device 90 is used to control the actuators 132 in a closed-loop control scheme.

The above description of the preferred embodiments has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

What is claimed is:

1. An apparatus, comprising:
   an optical surface; and
   a measurement device configured to measure a parameter related to the optical surface at a plurality of separated areas on the optical surface, the measurement device comprising:
   a) an illumination unit configured to direct individual measuring light beams towards the plurality of separated areas on the optical surface, each measuring light beam simultaneously illuminating: i) a portion of a first one of the plurality of separated areas on the optical surface which is associated with the measuring light beam; and ii) a portion of a second one of the plurality of separated areas on the optical surface which is not associated with the measuring light beam, the portion of the second one being adjacent the portion of the first one;
   b) a detector unit configured to measure a property for each measuring light beam after it has interacted with the optical surface; and
   c) an evaluation unit configured to determine the optical surface-related parameter for the portion of the first one based on the properties measured by the detector unit for: i) the measuring light beam that is associated with the portion of the first one; and ii) at least one measuring light beam that is associated with the portion of the second one,
   wherein the apparatus is a microlithographic projection exposure apparatus.

2. The apparatus of claim 1, wherein the optical surface-related parameter defines a shape of the optical surface.

3. The apparatus of claim 1, further comprising a surface deformation unit configured to deform the optical surface.

4. The apparatus of claim 1, wherein the optical surface is configured to reflect at least a substantial portion of the measuring light beams.

5. The apparatus of claim 1, wherein the optical surface comprises an array of mirrors configured to reflect an impinging light ray by a reflection angle that is variable in response to a control signal, each mirror has a mirror surface, and at least one of the plurality of separated areas is associated with each mirror surface.

6. The apparatus of claim 5, wherein the apparatus comprises an illumination system, the array of mirrors is arranged in the illumination system, and the mirrors are configured to direct projection light towards a system pupil surface of the illumination system.

7. The apparatus of claim 5, wherein each measuring light beam produces on the associated area a point of maximum intensity, and the points of maximum intensity are slightly and irregularly displaced with regard to centers of the mirrors.

8. The apparatus of claim 1, wherein the apparatus comprises an illumination system and a projection objective, and the optical surface is in the illumination system.

9. The apparatus of claim 1, wherein spots illuminated on the optical surface by the measuring light beams at least partially overlap.

10. The apparatus of claim 1, wherein the evaluation unit is configured to determine the optical surface-related parameter for the portion of the first one on the basis of the properties measured by the detector unit for all measuring light beams produced by the illumination unit.

11. The apparatus of claim 10, wherein the optical surface-related parameter for the portion of the first one k is $x_k$, and is determined by the following system of linear equations:

$$y_k = \sum_l A_{kl} x_l,$$

with $y_k$ being the property measured by the detector unit for the measuring light beam directed towards the portion of the first one, and $A_{kl}$ being real coefficients.

12. The apparatus of claim 11, wherein the coefficients $A_{kl}$ are determined by calibration.

13. The apparatus of claim 1, wherein the evaluation unit is configured to determine the optical surface-related parameter for the portion of the first one based only on the properties measured by the detector unit for the measuring light beams that are directed towards areas which are next neighbors of the portion of the first one and next but one neighbors of the portion of the first one.

14. The apparatus of claim 1, wherein the illumination unit comprises a plurality of illumination members, each illumination member has a light exit facet configured to emit one of the measuring light beams, and the areas which are illuminated on the optical surface are images of the light exit facets.

15. The apparatus of claim 14, further comprising an imaging system configured to commonly image more than one light exit facet on the optical surface.

16. The apparatus of claim 1, wherein the properties measured at the plurality of areas on the optical surface defines a shape of the optical surface.

17. The apparatus of claim 16, wherein the optical surface-related parameter defines the shape of the optical surface.

18. A system, comprising:
   an optical surface; and
   a measurement device configured to measure a parameter related to the optical surface at a plurality of separated areas on the optical surface, the measurement device comprising:
   a) an illumination unit configured to direct individual measuring light beams towards the plurality of separated areas on the optical surface, each measuring light beam simultaneously illuminating: i) a portion of a first one of the plurality of separated areas on the optical surface which is associated with the measuring light beam; and ii) a portion of a second one of the plurality of separated areas on the optical surface which is not associated with the measuring light beam, the portion of the second one being adjacent the portion of the first one;
   b) a detector unit configured to measure a property for each measuring light beam after it has interacted with the optical surface; and c) an evaluation unit configured to determine the optical surface-related parameter for the portion of the first one based on the properties measured by the detector unit for: i) the measuring light beam that is associated with the portion of the first one; and ii) at least one measuring light beam that is associated with the portion of the second one, wherein the system is a microlithographic illumination system.

19. A method, comprising:
a) directing individual measuring light beams towards areas on an optical surface of a microlithographic projection exposure apparatus, each measuring light beam simultaneously illuminating: i) a first portion of an area on the optical surface, the first portion associated with the measuring light beam; and ii) a second portion of an adjacent area on the optical surface, the second portion is not associated with the measuring light beam;
b) measuring a property for each measuring light beam after it has interacted with the optical surface;
c) determining the optical surface-related parameter for the first portion on the basis of the properties determined in b) for: i) the measuring light beam that is associated with the first portion and ii) at least one measuring light beam that is associated with the second portion.

20. The method of claim 19, wherein the microlithographic projection exposure apparatus comprises an illumination system, and the optical surface is in the illumination system.

\* \* \* \* \*